(12) United States Patent
Steinberger

(10) Patent No.: US 11,139,747 B2
(45) Date of Patent: Oct. 5, 2021

(54) BUSBAR POWER SUPPLY APPARATUS

(71) Applicant: Woehner GmbH & Co. KG Elektrotechnische Systeme, Roedental (DE)

(72) Inventor: Philipp Steinberger, Coburg (DE)

(73) Assignee: Woehner GmbH & Co. KG Elektrotechnische Systeme, Rödental (DE)

( * ) Notice: Subject to any disclaimer, the term of this patent is extended or adjusted under 35 U.S.C. 154(b) by 421 days.

(21) Appl. No.: 16/196,593

(22) Filed: Nov. 20, 2018

(65) Prior Publication Data
US 2019/0157981 A1 May 23, 2019

(30) Foreign Application Priority Data

Nov. 23, 2017 (EP) .................................. 17203342

(51) Int. Cl.
| | |
|---|---|
| *H02M 7/00* | (2006.01) |
| *H02J 5/00* | (2016.01) |
| *H05K 7/14* | (2006.01) |
| *H02B 1/21* | (2006.01) |
| *H02B 1/14* | (2006.01) |

(52) U.S. Cl.
CPC ............... *H02M 7/003* (2013.01); *H02J 5/00* (2013.01); *H05K 7/1432* (2013.01); *H05K 7/1482* (2013.01); *H02B 1/14* (2013.01); *H02B 1/21* (2013.01)

(58) Field of Classification Search
CPC ........ H02M 7/003; H02J 5/00; H05K 7/1432; H05K 7/1482; H02B 1/14; H02B 1/21

USPC .......................................................... 307/69
See application file for complete search history.

(56) References Cited

U.S. PATENT DOCUMENTS

| | | | | |
|---|---|---|---|---|
| 5,508,886 A | * | 4/1996 | Bernecker ............ | H05K 7/1474 361/733 |
| 5,995,362 A | * | 11/1999 | Morel ...................... | H02B 1/21 361/611 |
| 2015/0098257 A1 | * | 4/2015 | Wei ...................... | H02M 5/4585 363/37 |
| 2015/0295390 A1 | * | 10/2015 | Pellicano ................. | H02B 1/36 361/624 |
| 2015/0357774 A1 | * | 12/2015 | Ren ...................... | H01R 25/162 439/110 |

(Continued)

FOREIGN PATENT DOCUMENTS

| | | |
|---|---|---|
| EP | 2 793 540 A2 | 10/2014 |
| EP | 3 076 504 A1 | 10/2016 |
| EP | 3 246 996 A1 | 11/2017 |

(Continued)

OTHER PUBLICATIONS

International Search Report corresponding to European Appl. No. 17203342.5, dated May 30, 2018, (7 pages).

*Primary Examiner* — Alfonso Perez Borroto
(74) *Attorney, Agent, or Firm* — Maginot, Moore & Beck LLP

(57) ABSTRACT

A busbar power supply apparatus comprising at a rear side of its housing an AC interface with electrical contacts configured to establish an electrical connection with AC busbars of a busbar system to receive AC mains voltages converted by an integrated AC/DC power conversion unit into a DC power supply voltage applied to at least one DC interface of said busbar power supply apparatus.

19 Claims, 18 Drawing Sheets

(56) References Cited

U.S. PATENT DOCUMENTS

2018/0048303 A1 * 2/2018 Lenker .................. H01H 9/542

FOREIGN PATENT DOCUMENTS

| FR | 3 027 483 A3 | 4/2016 | |
|---|---|---|---|
| WO | 2013094797 A1 | 6/2013 | |
| WO | WO-2013094797 A1 * | 6/2013 | ........... H05K 7/1432 |

* cited by examiner

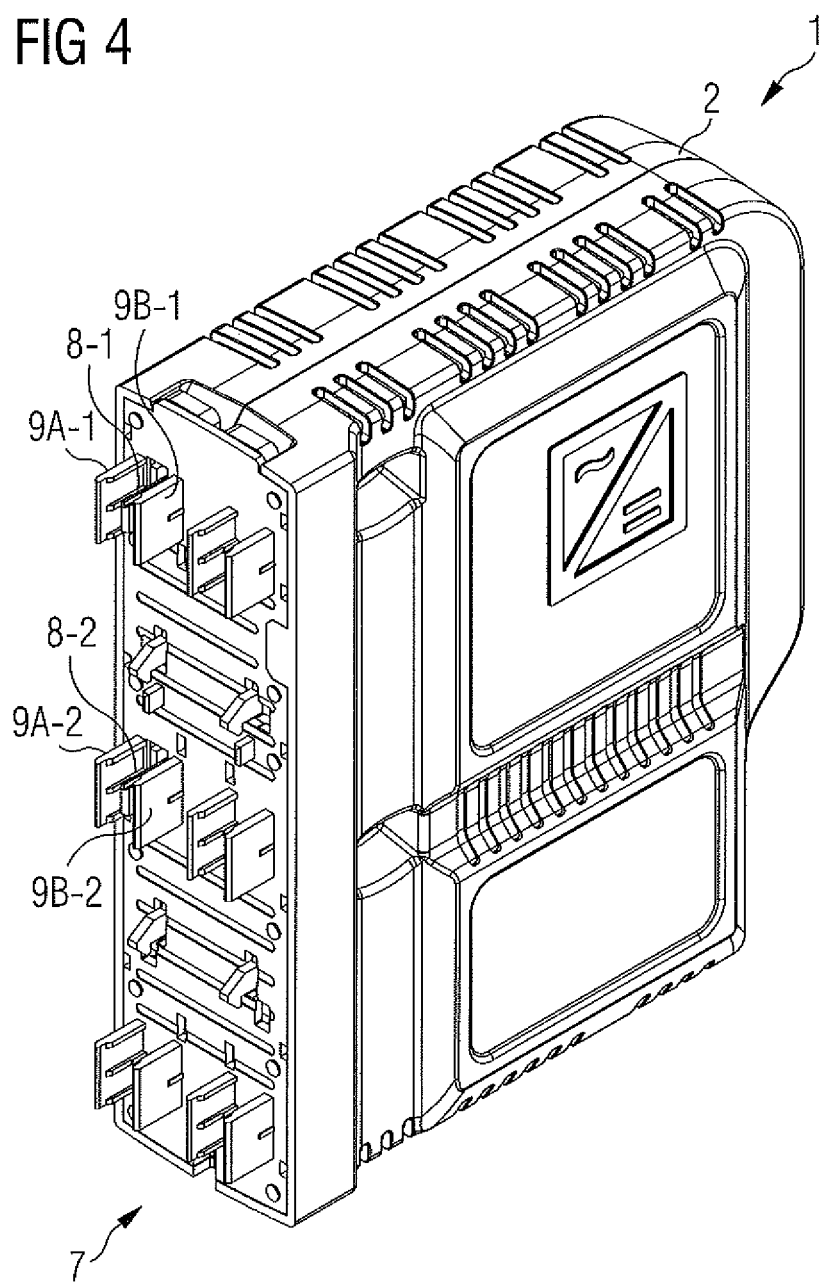

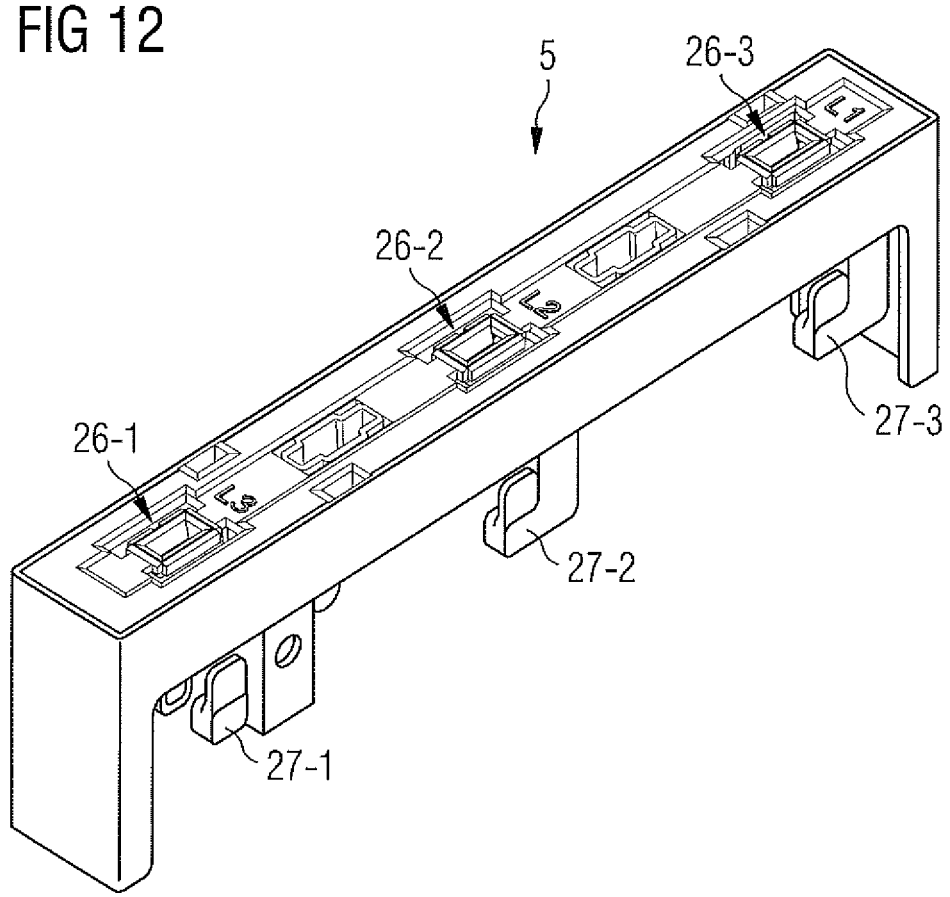

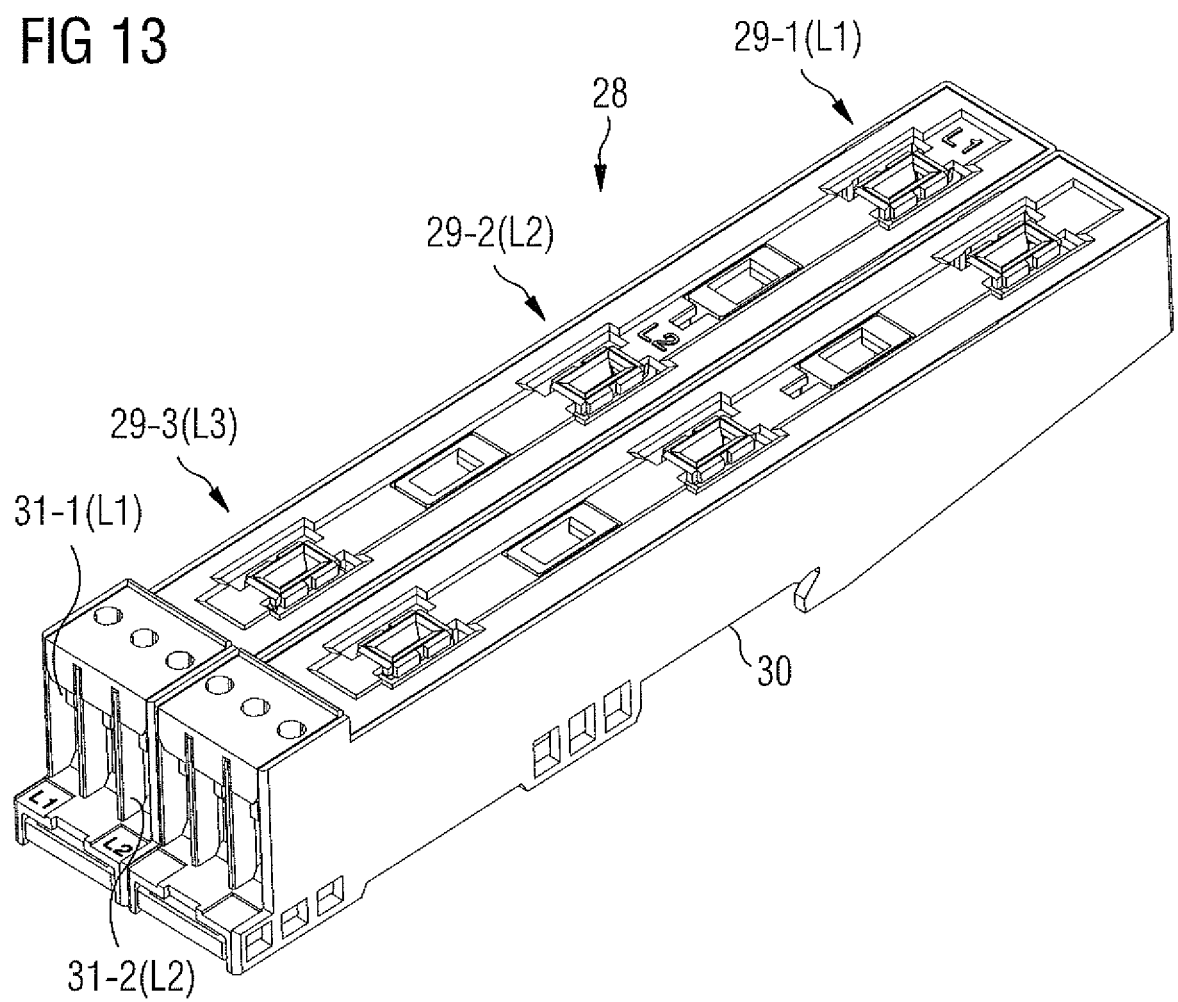

BUSBAR POWER SUPPLY APPARATUS

This application claims priority to European Application No. EP 17203342.5, filed on Nov. 23, 2017. The entire contents of the above-mentioned patent applications are incorporated herein by reference as part of the disclosure of this U.S. application.

The invention relates to a busbar power supply apparatus for a busbar system.

Busbar systems can comprise one or several busbars for providing power supply for electrical devices. In conventional busbar systems, electrical devices are directly or by means of adapters mounted to the different busbars of the busbar system. The busbars can carry one or several AC mains power supply voltages. One or several busbars are mounted in parallel and can carry different phases L1, L2, L3 of a power supply system. An electrical device which requires electrical power supply can be connected to the busbars carrying the AC mains power supply voltages by means of clamps and conductors. For each DC power supply mains voltage, a separate protective fuse is provided. The housing of the electrical device is normally mounted on a profile rail.

A disadvantage of a conventional busbar power supply system is that it is very cumbersome and time-consuming to connect electrical devices with the busbars of the busbar power supply system. Each power supply connection of the electrical device is to be connected separately via a fuse and a clamping unit to a separate busbar of the busbar power supply system. This takes some time and it cannot be guaranteed that all electrical connections are established correctly by the technician which performs the installation. A further disadvantage of a conventional power supply system is that it is not touch-safe for the technician performing the installation of the electrical connection between the electrical device and the busbar power supply system. Accordingly, it is necessary to interrupt the AC power mains voltage supply of the busbars during assembly of the electrical device. Also, after installation has been completed, the assembly is not absolutely touch-safe for a user. A further disadvantage of the conventional busbar power supply system is that the packaging of electrical devices mounted on the busbars is limited so that the available space is not efficiently used.

Accordingly, it is an object of the present invention to provide a busbar power supply apparatus which overcomes the above-mentioned drawbacks and which allows a reliable and touch-safe power supply of electrical devices by a busbar system.

This object is achieved according to a first aspect of the present invention by a busbar power supply apparatus comprising, according to a first aspect, a busbar power supply apparatus comprising at a rear side of its housing an AC interface with electrical contacts configured to establish an electrical connection with AC busbars of a busbar system to receive AC mains voltages converted by an integrated AC/DC power conversion unit into a DC power supply voltage applied to at least one DC interface of said busbar power supply apparatus.

In a possible embodiment, at least one DC interface is provided on the same rear side of the housing as the AC interface to provide connection to two DC busbars extending in parallel to the AC busbars of the busbar system.

In a further possible embodiment, at least one DC interface is provided on a front side of the housing of the busbar power supply apparatus.

In a still further possible embodiment, the housing of the busbar power supply apparatus has at least one DC interface on a rear side facing DC busbars extending in parallel to the AC busbars and at least one DC interface on a front side.

In a possible embodiment of the busbar power supply apparatus according to the first aspect of the present invention, the electrical contacts of the AC interface are configured to be guided through guide openings of a touch-safe protection cover including the AC busbars and to be inserted into matching contact slots within the AC busbars to establish the electric connection with the AC busbars.

In a further possible embodiment of the busbar power supply apparatus according to the first aspect of the present invention, the electrical contacts of the AC interface are configured to be inserted into matching contact slots of a busbar adapter mounted on the AC busbars to establish the electrical connection with the AC busbars of said busbar power supply apparatus by said busbar adapter.

In a further possible embodiment of the busbar power supply apparatus according to the first aspect of the present invention, the electrical contacts of the AC interface are configured to be attached with massive busbars which do not comprise contact slots.

In a still further possible embodiment of the busbar power supply apparatus according to the first aspect of the present invention, the AC interface is connected to an internal fuse integrated in the housing of said busbar power supply apparatus.

In a still further possible embodiment of the busbar power supply apparatus according to the first aspect of the present invention, the busbar power supply apparatus comprises a circuit having an input filter unit adapted to filter the AC mains voltages received via the AC interface of said busbar power supply apparatus.

In a further possible embodiment of the busbar power supply apparatus according to the first aspect of the present invention, the busbar power supply apparatus further comprises a rectifier unit adapted to rectify the filtered AC mains voltages.

In a further possible embodiment of the busbar power supply apparatus according to the first aspect of the present invention, the busbar power supply apparatus further comprises an inrush current limiter unit.

In a further possible embodiment of the busbar power supply apparatus according to the first aspect of the present invention, the busbar power supply apparatus further comprises a power factor correction unit to provide a power factor correction connected to an input of the AC/DC power conversion unit of said busbar power supply apparatus.

In a further possible embodiment of the busbar power supply apparatus according to the first aspect of the present invention, the busbar power supply apparatus further comprises an output filter unit which is provided between an output of said AC/DC power conversion unit and the DC interface of said busbar power supply apparatus.

In a further possible embodiment of the busbar power supply apparatus according to the first aspect of the present invention, the busbar power supply apparatus comprises a relay unit connected to said AC/DC power conversion unit and adapted to monitor the output voltage of said AC/DC power conversion unit.

In a further possible embodiment of the busbar power supply apparatus according to the first aspect of the present invention, the relay unit is adapted to close an AC-OK contact of said DC interface if the monitored output voltage of said AC/DC power conversion unit exceeds a predetermined threshold voltage.

In a further possible embodiment of the busbar power supply apparatus according to the first aspect of the present invention, the busbar power supply apparatus further comprises an overtemperature protection unit adapted to shut down the AC/DC power conversion unit if a measured temperature exceeds a predetermined temperature.

In a still further possible embodiment of the busbar power supply apparatus according to the first aspect of the present invention, the busbar power supply apparatus further comprises an overvoltage protection unit adapted to shut down the AC/DC power conversion unit if a measured DC voltage at the DC interface exceeds a predetermined voltage.

In a further possible embodiment of the busbar power supply apparatus according to the first aspect of the present invention, the AC busbars of the busbar system to which the busbar power supply apparatus is connected are formed by parallel busbars extending in horizontal direction.

In a further possible embodiment of the busbar power supply apparatus according to the first aspect of the present invention, the DC interface of said busbar power supply apparatus is connectable with further DC interfaces of other busbar power supply apparatuses in parallel to increase the DC output current and/or in series to increase the DC output voltage.

In a further possible embodiment of the busbar power supply apparatus according to the first aspect of the present invention, the housing of said busbar power supply apparatus is made of an electrically insulating material and is formed to provide convection cooling of electrical units integrated in the housing.

In a further possible embodiment of the busbar power supply apparatus according to the first aspect of the present invention, the busbar power supply apparatus further comprises a communication unit to provide communication signalling via DC communication busbars and/or AC busbars of the busbar system with other busbar power supply apparatuses of said busbar system and/or with an external controller of said busbar system.

In a further possible embodiment of the busbar power supply apparatus according to the first aspect of the present invention, the communication signals carried via the DC communication busbars and/or AC busbars comprise commands to adjust the DC power supply voltage output at the DC interface of the busbar power supply apparatus and/or to switch on/off the busbar power supply apparatus.

In a still further possible embodiment of the busbar power supply apparatus according to the first aspect of the present invention, the AC/DC power conversion unit is configured to separate galvanically its AC input from its DC output.

In a further possible embodiment of the busbar power supply apparatus according to the first aspect of the present invention, the AC mains interface is configured to establish an electrical connection with at least two busbars of the busbar system to receive at least one AC mains voltage.

In a further possible embodiment of the busbar power supply apparatus according to the first aspect of the present invention, the AC interface of the busbar power supply apparatus is further configured to establish an electrical connection with a profile rail adapter mounted on a profile rail and having at a front side electrical contacts to receive AC mains voltages supplied by said profile rail adapter to the electrical contacts of the AC interface.

In a further possible embodiment of the busbar power supply apparatus according to the first aspect of the present invention, the AC interface further comprises protection ribs to protect the electrical contacts of the AC interface and to provide mechanical support of the busbar power supply apparatus.

The invention provides according to this further aspect an automation system comprising power consuming electrical devices each receiving a DC power supply from a DC interface of a busbar power supply apparatus according to the first aspect of the present invention connected to AC busbars of a busbar system.

In the following, possible embodiments of the different aspects of the present invention are described in more detail with reference to the enclosed figures.

FIG. 4 illustrates a possible exemplary embodiment of an AC interface of a busbar power supply apparatus according to the first aspect of the present invention;

FIG. 12 illustrates a possible exemplary embodiment of a busbar adapter to which a busbar power supply apparatus according to the first aspect of the present invention can be mounted;

FIG. 13 shows a possible exemplary embodiment of a profile rail adapter which can be used to connect a busbar power supply apparatus according to the first aspect of the present invention to an AC power supply.

Figure 1:
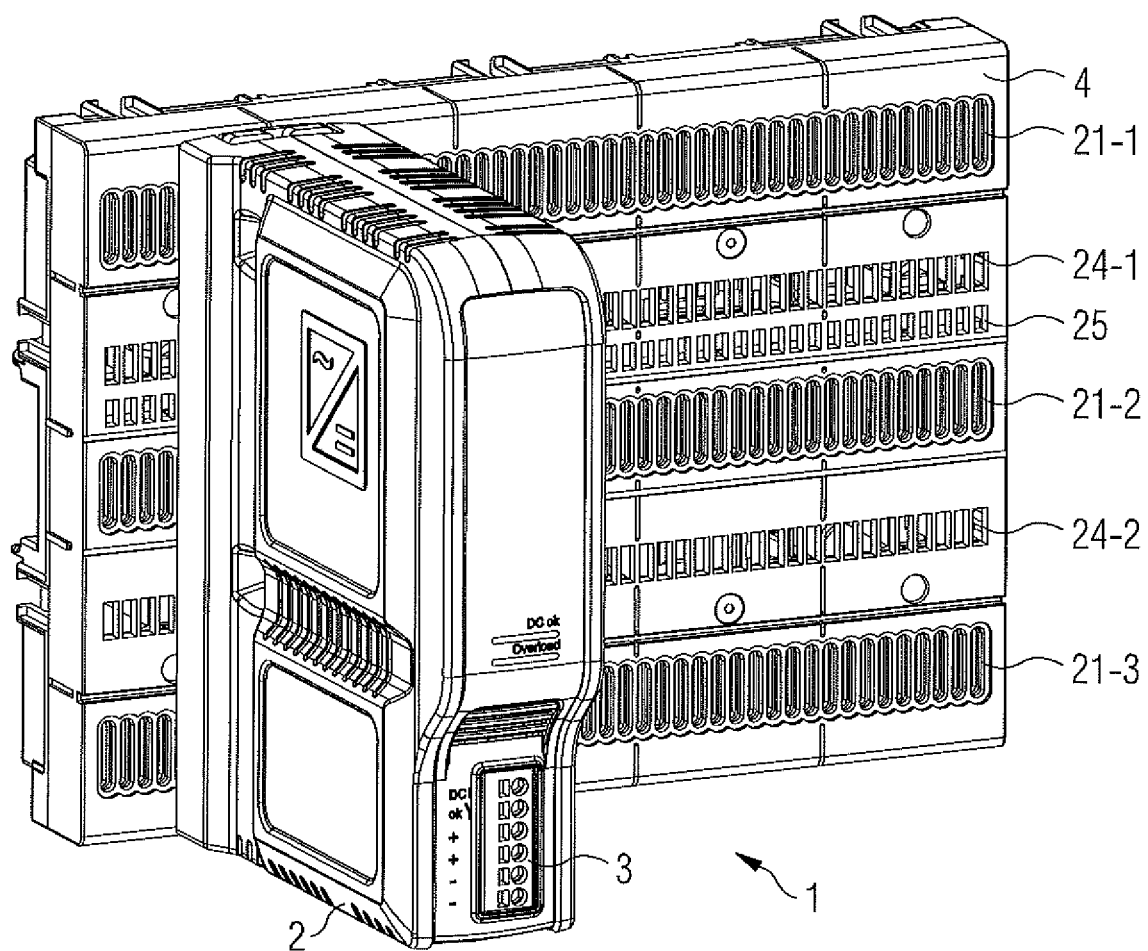
FIG. 1 illustrates a possible exemplary embodiment of a busbar power supply apparatus according to the first aspect of the present invention mounted on a protection cover including AC busbars.
Figure 5:
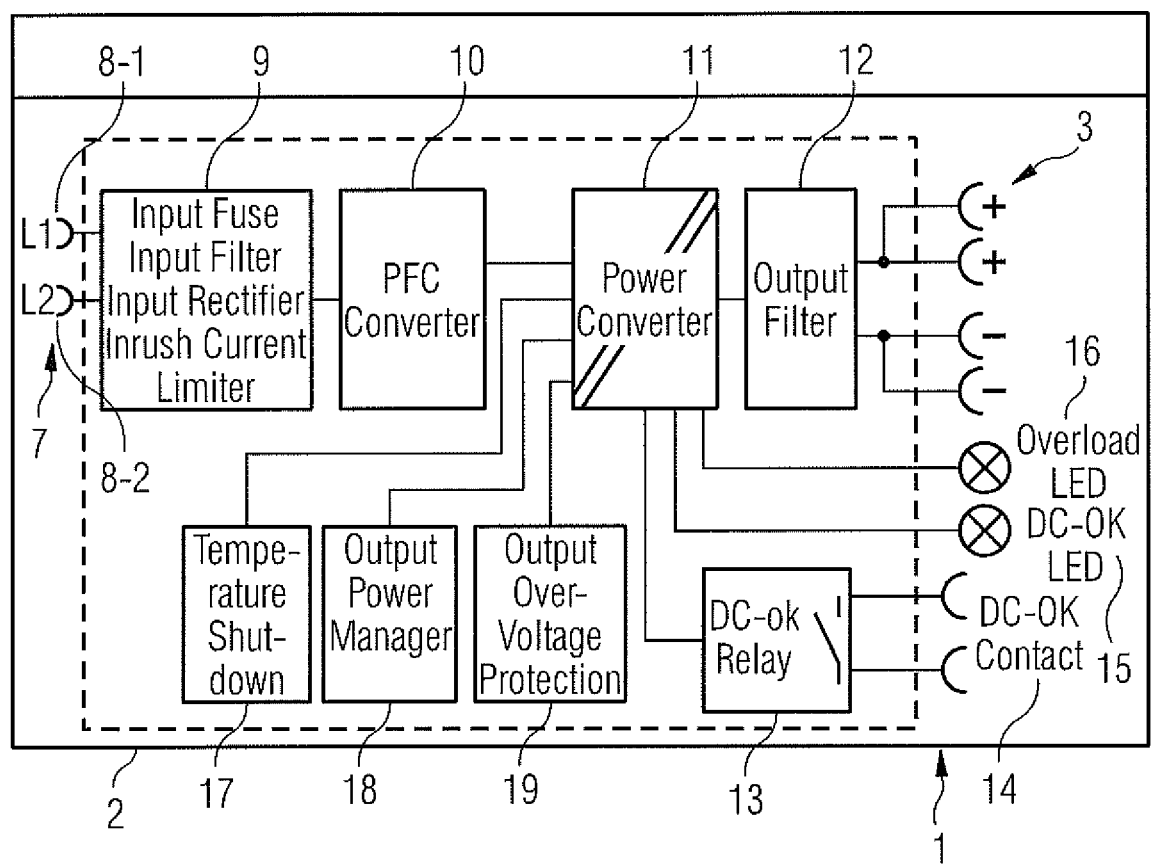
FIG. 5 shows a block diagram of a possible exemplary embodiment of a busbar power supply apparatus according to the first aspect of the present invention.

As can be seen in the embodiment of FIG. 1, the busbar power supply apparatus 1 according to the first aspect of the present invention can comprise a housing 2 including different electrical units or electrical components as also illustrated in the block diagram of FIG. 5. The housing 2 can be made of an electrically insulating material. The housing 2 of the busbar power supply apparatus 1 can further be formed such that it provides convection cooling of all electrical units integrated in the housing 2. The housing 2 can in particular comprise cooling slots to provide convection cooling of the integrated electrical units as also visible in FIG. 1. The busbar power supply apparatus 1 comprises at a rear side of its housing 2 an AC interface 7 with electrical contacts as illustrated in FIG. 4. The electrical contacts 8 of the AC interface 7 are configured to establish an electrical connection with AC busbars 6 of a busbar system to receive AC mains voltages L. The received AC mains voltages are converted by an integrated AC/DC power conversion unit 11 of the busbar power supply apparatus 1 shown in the block diagram of FIG. 5 into a DC power supply voltage. The DC power voltage output by the integrated AC/DC power conversion unit 11 is applied to at least one DC interface 3 of the busbar power supply apparatus 1. In the embodiment illustrated in FIG. 1, the busbar power supply apparatus 1 comprises a single DC interface 3. In further possible embodiments, the busbar power supply apparatus 1 can also comprise more than one DC interfaces 3 for different electrical devices receiving a DC power supply. In the illustrated embodiment of FIG. 1, the DC interface 3 is located at a front side of the housing 2 of the busbar power supply apparatus 1, i.e. opposite to the AC interface 7 located at the rear side of housing 2.

In a further possible embodiment, a DC interface can also be provided at the rear side of the housing, i.e. on the same side as the AC interface, to provide electrical connection with two DC busbars extending in parallel to the AC busbars. The DC power supply voltages can then be supplied via the DC busbars to different power-consuming devices attached to the DC busbars. This allows complete plug and play and facilitates the assembly even further.

Figure 11A:
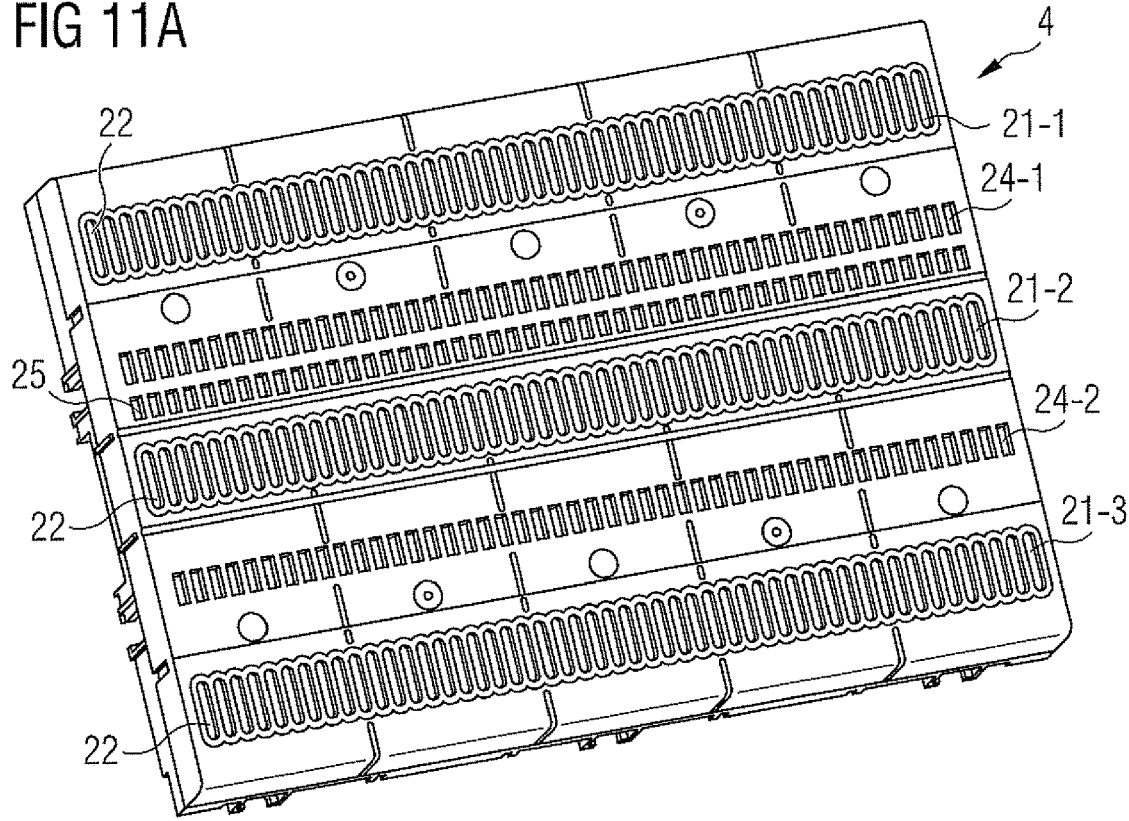
FIGS. 11A, 11B illustrate a possible exemplary embodiment of a touch-safe protection cover to which a busbar power supply apparatus according to the first aspect of the present invention can be mounted.
Figure 11B:
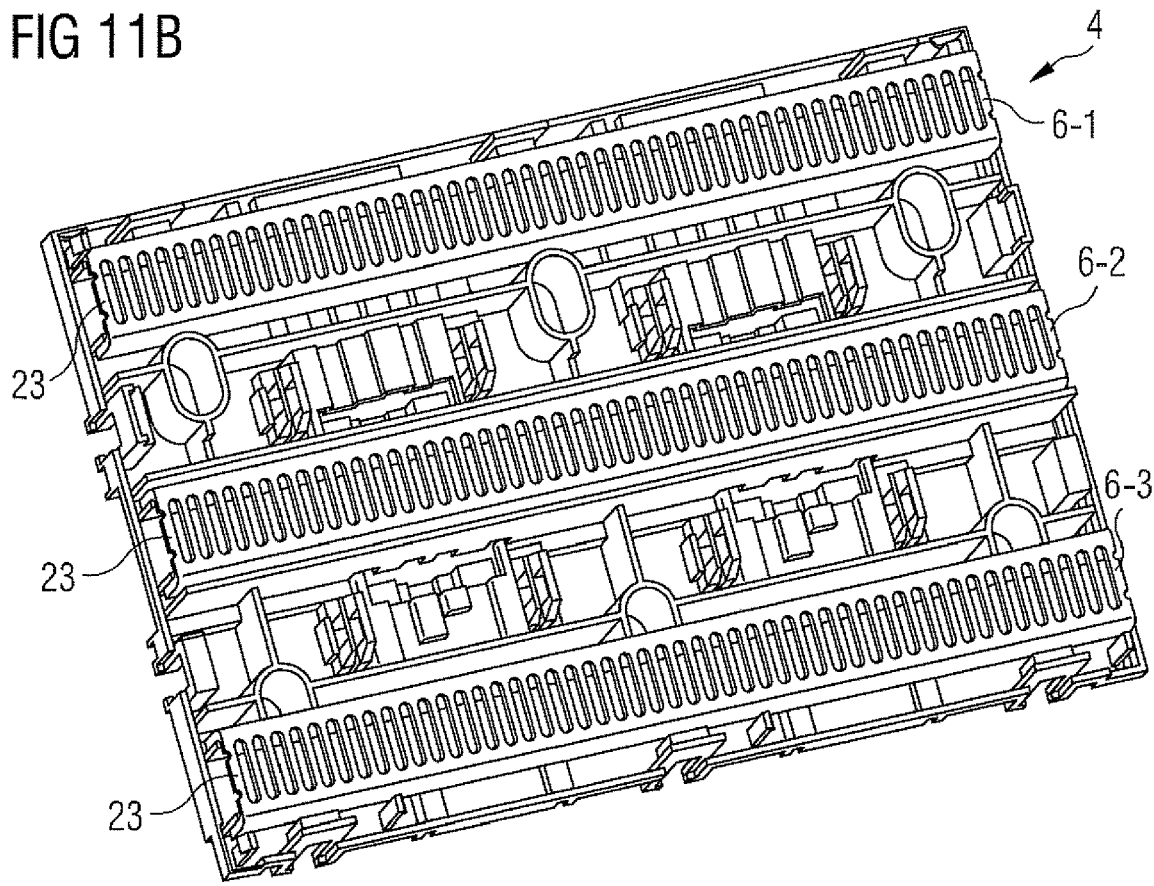

In the assembly illustrated in FIG. 1, the busbar power supply apparatus 1 is connected to a touch-safe protection cover 4. The electrical contacts of the AC interface 7 of the busbar power supply apparatus 1 at the rear side of its housing 2 are configured to be guided through guide openings 22 of the touch-safe protection cover 4 shown also in FIG. 11A. The protection cover 4 is also formed of an electrical insulating material and includes AC busbars 6 as also illustrated in FIGS. 11A, 11B. The electrical contacts 8 of the AC interface 7 of the busbar power supply apparatus 1 are not only configured to be guided through guide openings 22 of the touch-safe protection cover 4 but also to be inserted into matching contact slots 23 within the AC busbars 6 to establish an electrical connection with the AC busbars 6 located within the touch-safe protection cover 4. In the embodiment illustrated in FIG. 1, a single busbar power supply apparatus 1 is mounted on the touch-safe protection cover 4. It is possible to mount a plurality of busbar power supply apparatuses 1 to a single touch-safe protection cover 4. The different busbar power supply apparatuses 1 are positioned in parallel on the touch-safe protection cover 4 and require only a minimum space. In a possible embodiment, the housings 2 of the different busbar power supply apparatuses 1 can be formed such that they provide cooling funnels in vertical direction to increase cooling of the electrical components integrated in the housing 2 of the different busbar power supply apparatuses 1 mounted to the touch-safe protection cover 4. As illustrated in FIG. 1, the busbars integrated in the touch-safe protection cover 4 extend in a preferred embodiment in horizontal direction as also visible from FIGS. 11A, 11B. The busbar power supply apparatus 1 can be set on the front surface of the touch-safe protection cover 4 and pressed against the touch-safe protection cover 4 such that the electrical contacts of the AC interface 7 are guided through the guide openings 22 of the touch-safe protection cover 4 including the horizontal AC busbars 6 and then inserted into the matching contact slots 23 within the AC busbars 6 to establish the electrical connection with the AC busbars 6 of the busbar system. The electrical contacts of the AC interface 7 can be formed as illustrated in FIG. 4 showing protruding electrical contacts 8-1, 8-2 which can be hook-shaped to be pressed flexibly together for insertion into the slots. Alternatively, the electrical contacts can be formed flat to be pressed against a surface of a conventional massive AC busbar which does not comprise contact slots.

Figure 2:
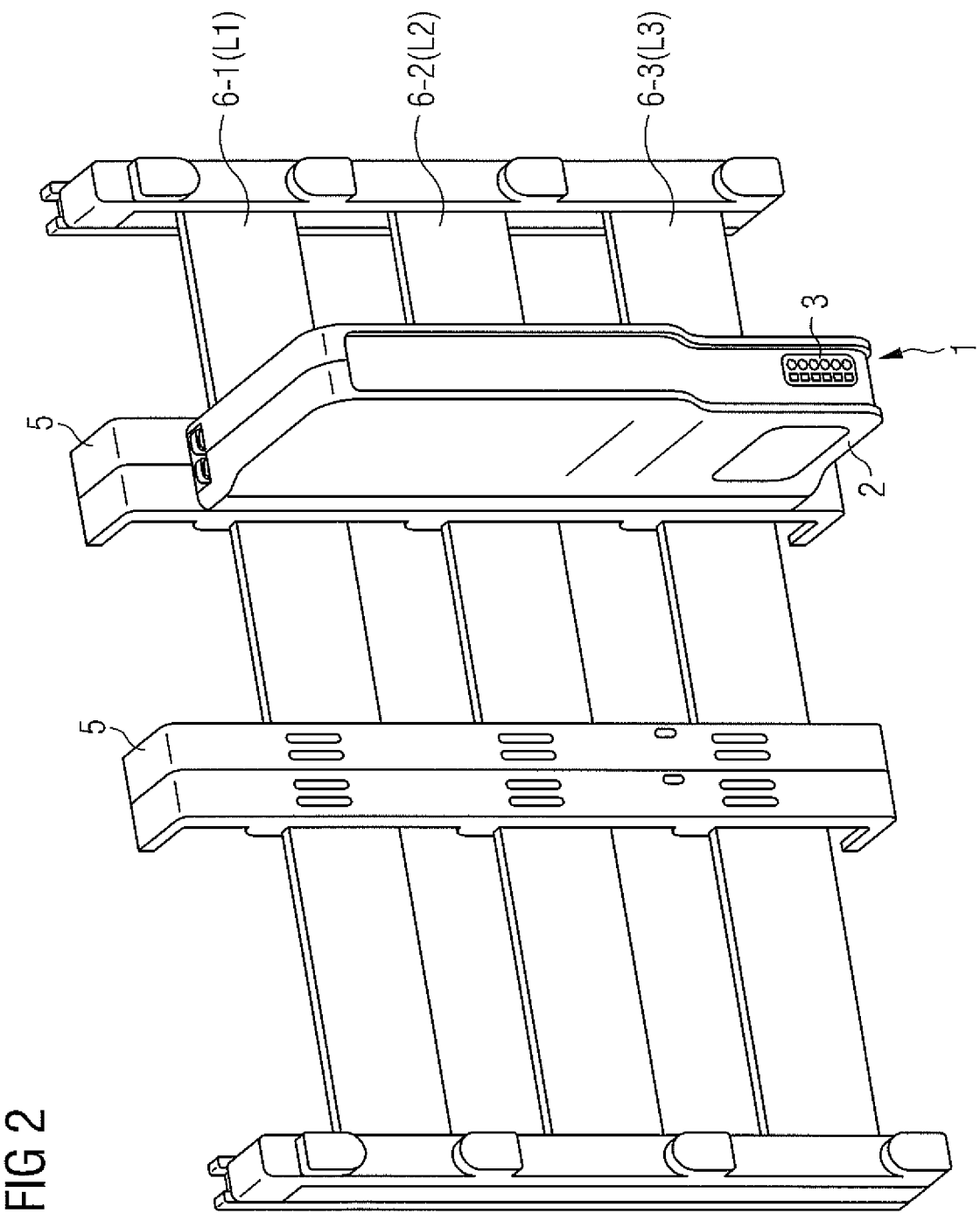
FIG. 2 illustrates a further possible exemplary embodiment of a busbar power supply apparatus according to the first aspect of the present invention mounted on a busbar adapter for busbars.

FIG. 1 shows an assembly of the busbar power supply apparatus 1 mounted on a touch-safe protection cover 4. FIG. 2 shows an alternative embodiment where a busbar power supply apparatus 1 having a housing 2 and a DC interface 3 at its front side is mounted by means of a busbar adapter 5 to three different AC busbars 6-1, 6-2, 6-3 each carrying an AC mains voltage phase L1, L2, L3. As can be seen in FIG. 2, the busbar system of FIG. 2 comprises three AC busbars 6 carrying AC mains voltages L and mounted in parallel to each other in horizontal direction. A possible embodiment of the adapter 5 illustrated in FIG. 2 is shown in more detail in FIG. 12.

Whereas the busbars integrated in the touch-safe protection cover 4 of FIG. 1 comprise matching contact slots 23 as also illustrated in FIG. 11B, the AC busbars 6 shown in the embodiment of FIG. 2 can be formed by conventional busbars without contact slots. The AC mains voltages L carried by the busbars 6-1, 6-2, 6-3 are converted by the integrated AC/DC power conversion unit 11 of the busbar power supply apparatus 1 into a DC power supply voltage and applied via the DC interface 3 to a connected power-consuming electrical device. The power-consuming electrical device can be for instance a controller of an automation system.

Figure 3A:
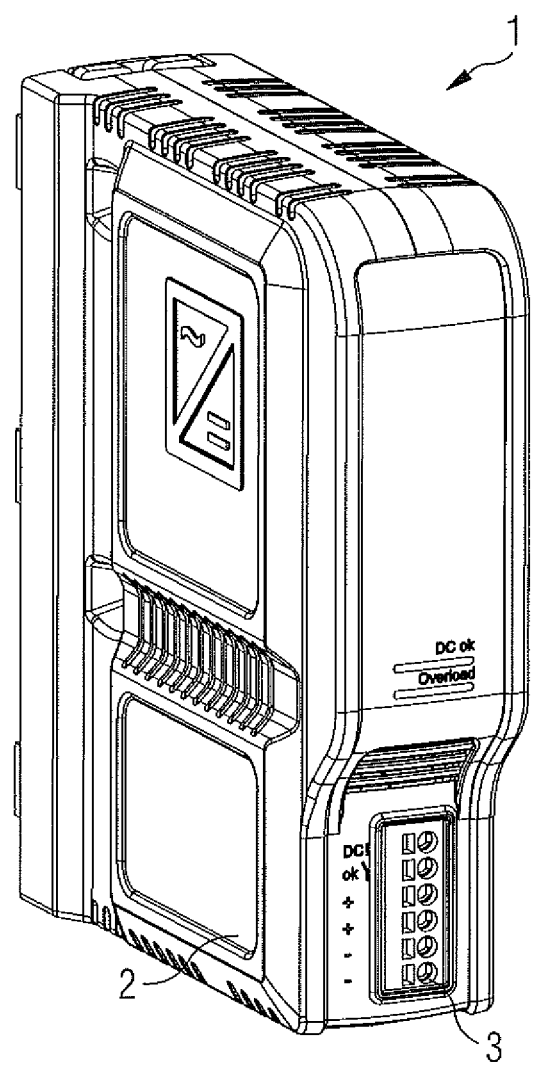
FIGS. 3A, 3B, 3C illustrate different possible variants of a busbar power supply apparatus according to the first aspect of the present invention with and without adapters.
Figure 3B:
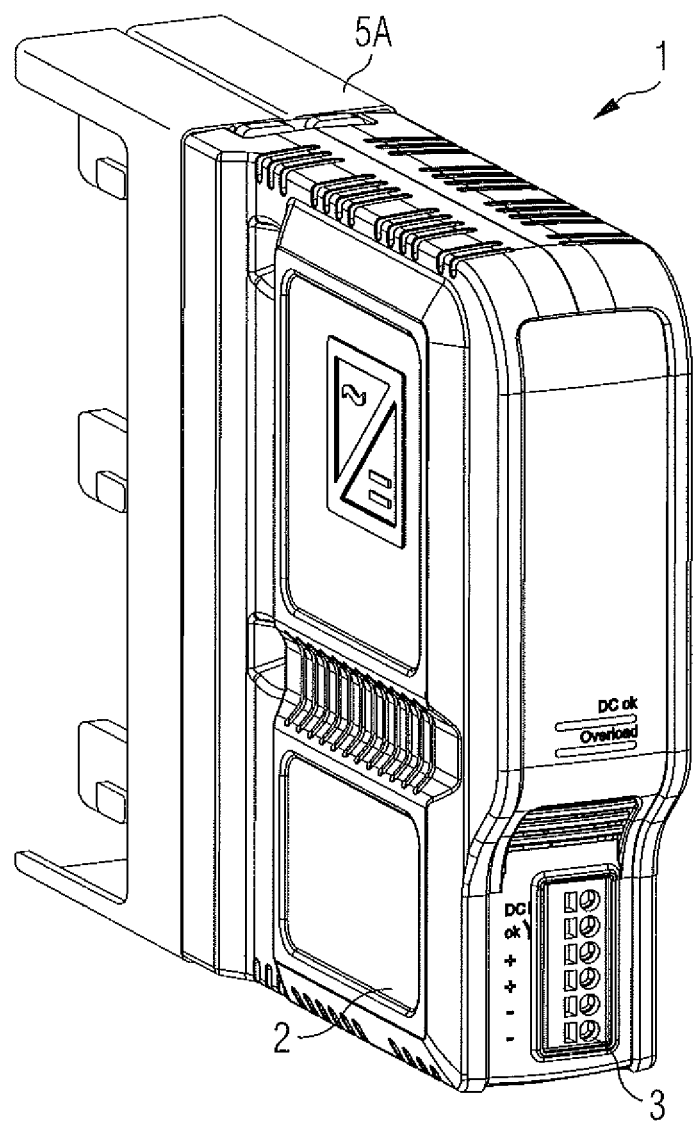
Figure 3C:
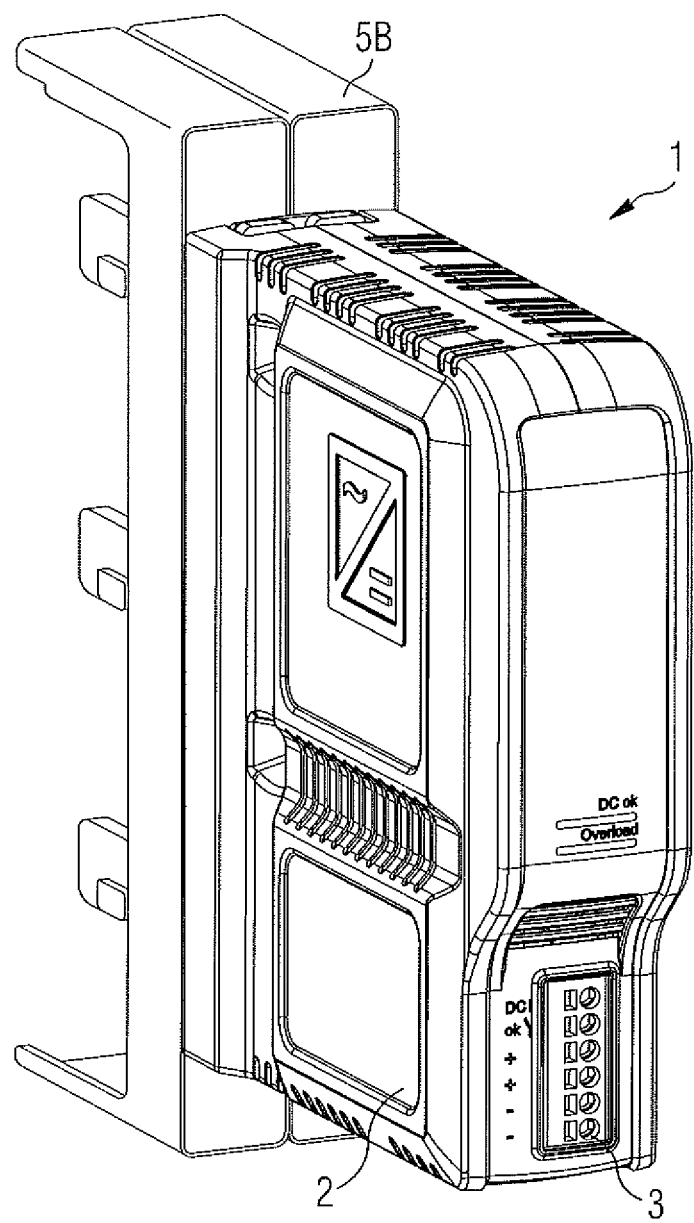

FIGS. 3A, 3B, 3C show possible exemplary variants of a busbar power supply apparatus 1 according to the first aspect of the present invention. The first variant illustrated in FIG. 3A is configured to be connected to a touch-safe protection cover 4 or crossboard as illustrated in FIG. 1. The second variant illustrated in FIG. 3B is adapted to be connected by means of a busbar adapter 5A of a busbar system. Similar, the third variant illustrated in FIG. 3C is configured to be connected to busbars by means of a busbar adapter 5B. As can be seen from the variants illustrated in FIGS. 3B, 3C, the busbars such as the AC busbars 6-1, 6-2, 6-3 illustrated in FIG. 2 can comprise a different size, in particular width, for different systems. The busbar adapter 5A is implemented for busbars comprising a smaller width than the busbars to which the second busbar adapter 5B illustrated in FIG. 3C can be connected.

FIG. 4 shows a further perspective view on the housing 2 of the busbar power supply apparatus 1 according to the first aspect of the present invention. FIG. 4 shows a possible exemplary embodiment of an AC interface 7 located at a rear side of the housing 2. In the illustrated embodiment, an AC interface 7 comprises two electrical contacts 8-1, 8-2 protruding from the housing 2 of the busbar power supply apparatus 1. The protruding electrical contacts 8 are configured in the illustrated embodiment to be guided through guide openings 22 of the touch-safe protection cover 4 illustrated in FIG. 1. After having been guided through the guide openings 22, the electrical contacts 8-i are inserted into matching contact slots within the AC busbars 6-1, 6-2, 6-3 to establish the electrical connection with the AC busbars. As can be seen in the embodiment of FIG. 4, each electrical contact 8-1, 8-2 can be protected on both sides by a pair of protection ribs 9A-1, 9B-1, 9A-2, 9B-2. The protection ribs 9A, 9B can on the one hand protect the intermediate electrical contact 8 against mechanical deformation and additionally provide mechanical support of the busbar power supply apparatus 1 mounted to the touch-safe protection cover 4. The AC interface 7 illustrated in FIG. 4 comprises two electrical contacts 8-1, 8-2 to connect the busbar power supply apparatus 1 to two parallel AC busbars 6 and to receive two AC mains voltages L1, L2 from a busbar system. The number of electrical contacts 8-i of the AC interface 7 can vary depending on the use case. The AC interface 7 of the busbar power supply apparatus 1 comprises at least two electrical contacts 8 for connection to two different phases (L1, L2; L2, L3; L1, L3) of the mains power supply system or for connection to a mains power supply voltage $L_x$ and a protection busbar N.

As illustrated in FIG. 4, the AC interface 7 can comprise additional ribs to improve the mechanical support of the busbar power supply apparatus 1 further.

FIG. 5 shows a block diagram of a possible exemplary embodiment of a busbar power supply apparatus 1 according to the first aspect of the present invention. In the illustrated exemplary embodiment, the AC interface 7 of the busbar power supply apparatus 1 comprises two electrical contacts 8-1, 8-2 for receiving a first AC mains voltage L1 and a second mains voltage L2. For each AC mains voltage L, an internal fuse can be provided which is integrated in the housing 2 of the busbar power supply apparatus 1. In the illustrated embodiment of FIG. 5, the busbar power supply apparatus 1 comprises an electronic stage 9 including the internal fuses of the AC mains voltages L1, L2, an input filter unit, a rectifier unit, an inrush current limiter unit. The tripping of the internal fuses within the AC electronic stage 9 can be caused in a possible embodiment by an internal defect. If a damage or malfunction occurs, for instance during installation or operation of the busbar power supply apparatus 1, the internal fuses immediately turn the electrical power off such that the busbar power supply apparatus 1 can be sent to the factory of the manufacturer for inspection. The housing 2 of the busbar power supply apparatus 1 further provides protection against electrical, mechanical and fire hazards. The busbar power supply apparatus 1 is suitable to be supplied from a TN, TT and IT mains power supply network. In a possible embodiment, the AC voltage between the AC-power supply terminals 8 of the AC interface 7 and a PE potential does not exceed 575 VAC continuously. The busbar power supply apparatus 1 can be implemented as a class of protection II equipment according to IEC 61140 such that a PE (protection earth) connection is not required.

The input filter unit of the AC electrical input stage 9 can be adapted to a filter the AC mains voltages received via the AC interface 7 of the busbar power supply apparatus 1. The rectifier unit within the electrical stage 9 can be adapted to rectify the filtered AC mains voltages. Further, the inrush current limiter unit provides current limitation.

In the embodiment illustrated in FIG. 5, the busbar power supply apparatus 1 further comprises a power factor correction unit 10. The power factor correction unit 10 is adapted to provide a power factor correction PFC and is connected to an AC-input of the AC/DC conversion unit 11 of the busbar power supply apparatus 1. The AC/DC power conversion unit 11 comprises the AC input and a DC output. In a possible embodiment, the AC/DC power conversion unit 11 is configured to separate galvanically its AC input from its DC output. The DC output of the AC/DC power conversion unit 11 is connected to an output filter unit 12 of the busbar power supply apparatus 1. This output filter unit 12 is provided between the DC-output of the AC/DC power conversion unit 11 and the DC interface 3 of the busbar power supply apparatus 1. The output can be protected in a possible embodiment electronically against no load, overload and short circuit. In a possible embodiment, the DC interface 3 of the busbar power supply apparatus 1 provides a DC voltage of 24 V. The input AC voltage can in a possible embodiment range between 380 V and 480 V having a mains frequency of e.g. 50 or 60 Hz. The power factor correction PFC provided by the PFC-circuit 10 can in a possible embodiment be adjustable. The DC interface 3 shown in FIG. 5 can be on the opposite side (front side) as the AC interface 7 or on the same side (rear side) as the AC interface 7. More than one DC interface 3 can be provided, e.g. a first DC interface on the front side of the housing 2 and a second DC interface on the rear side of the housing 2.

In the embodiment illustrated in FIG. 5, the busbar power supply apparatus 1 further comprises a relay unit 13 connected to the AC/DC power conversion unit 11 and adapted to monitor the output voltage of the AC/DC power conversion unit 11. The relay unit 13 is adapted to close an AC-OK contact 14 of the DC interface 3 if the monitored output voltage of the AC/DC power conversion unit 11 exceeds a predetermined threshold. The DC interface 3 can further comprise in a possible embodiment a DC-OK LED 15 and an overload LED 16 as illustrated in FIG. 5. The DC-OK LED 15 and the overload LED 16 are both connected to the AC/DC power conversion unit 11 as shown in FIG. 5. In a possible embodiment, the overload LED 16 is on when the DC voltage provided by the AC/DC power conversion unit 11 falls below a predetermined threshold of e.g. 20 V or in case of a short circuit at the output. Further, in a possible implementation, the overload LED 16 is flashing when the power supply apparatus 1 has been switched off due to overtemperature. In a possible embodiment, the busbar power supply apparatus 1 comprises an overtemperature protection circuit 17 adapted to shut down the AC/DC power conversion unit 11 if a measured temperature T exceeds a predetermined temperature. In case of a high temperature beyond a predetermined temperature threshold, the output shuts down and starts automatically again after cooling. The busbar power supply apparatus 1 can further comprise in a possible implementation as illustrated in FIG. 5 an output power managing unit 18. In a still further possible embodiment, the busbar power supply apparatus 1 can further comprise an overvoltage protection unit 19 adapted to shut down the AC/DC power conversion unit 11 if a measured DC voltage at the DC interface 3 exceeds a predetermined voltage.

In a possible embodiment, the busbar power supply apparatus 1 can be equipped with a specific overload characteristic.

Figure 6:
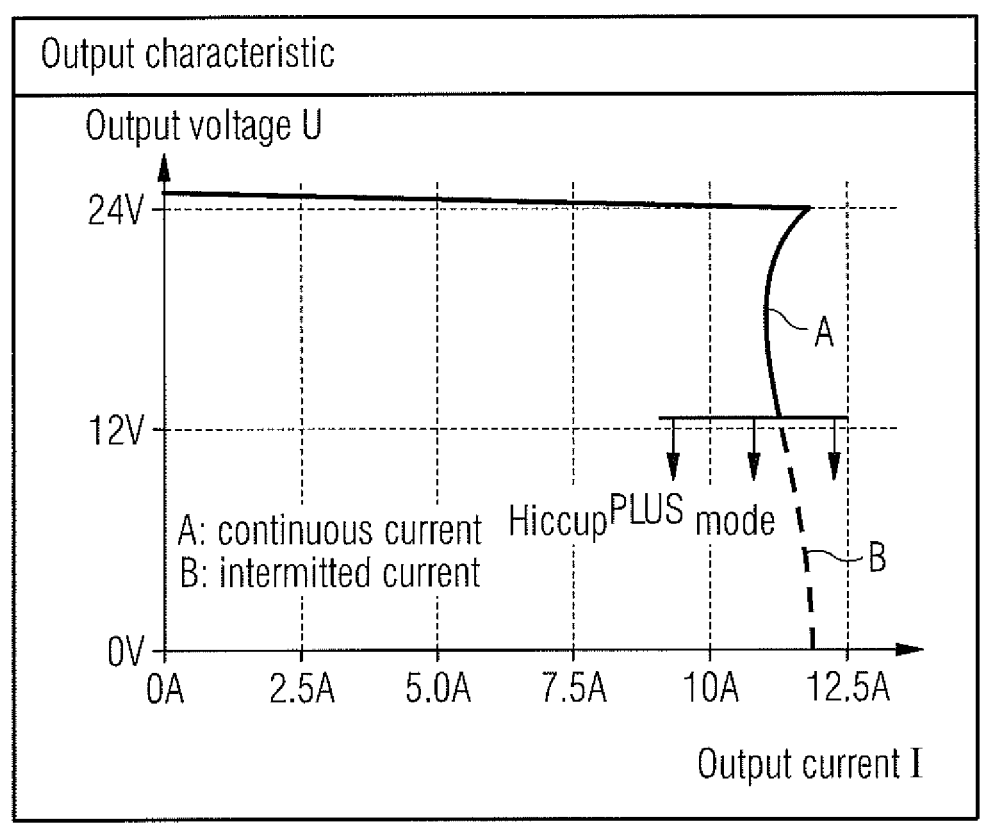
FIG. 6 shows a diagram for illustrating a voltage output characteristic of a busbar power supply apparatus as illustrated in FIG. 5.

FIG. 6 illustrates an output voltage U depending on an output current I where A indicates a characteristic for a continuous current and B a characteristic for an intermitted current. If a heavy overload does occur, i.e. when the output voltage falls below a predetermined threshold of e.g. 13 V, the apparatus 1 delivers a continuous output current I for a specific time period of e.g. 2 sec. After this, the output can be switched off for e.g. 7 sec before a new start attempt is automatically performed. This cycle can be repeated as long as the overload exists. If the overload has been cleared, the busbar power supply apparatus 1 can again operate normally.

In a possible embodiment, the busbar power supply apparatus 1 can be featured with a soft output regulation characteristic in order to achieve current share between multiple devices when they are connected in parallel to each other. This soft output regulation characteristic can regulate the output voltage in such a manner that the voltage at no load is approximately 4% higher than at nominal load.

Figure 7:
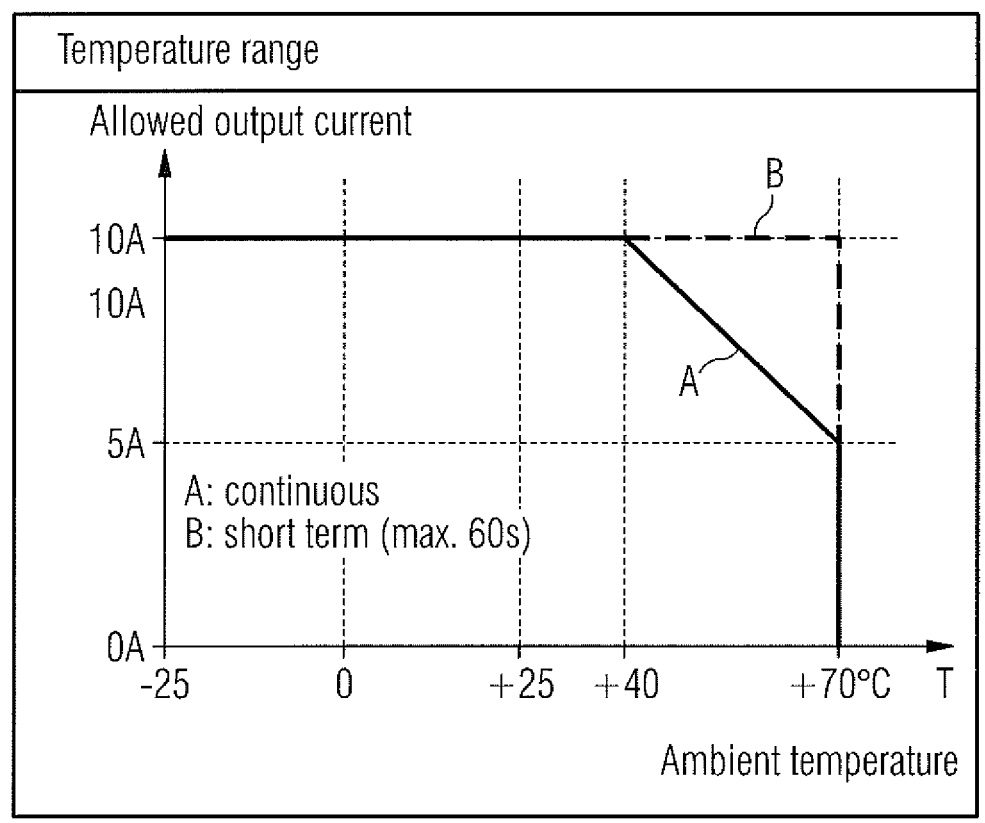
FIG. 7 shows a diagram for illustrating a temperature range of a busbar power supply apparatus as illustrated in FIG. 5.

The busbar power supply apparatus 1 can be connected in series and/or in parallel with similar busbar power supply apparatuses 1 as also illustrated in the embodiments of FIGS. 8, 9, 10. The busbar power supply apparatuses 1 can be connected in parallel to increase the output power. Several busbar power supply apparatuses 1 can also be connected in series to each other to increase the output voltage. FIG. 7 illustrates the allowed output current at an ambient temperature T.

Figure 8A:
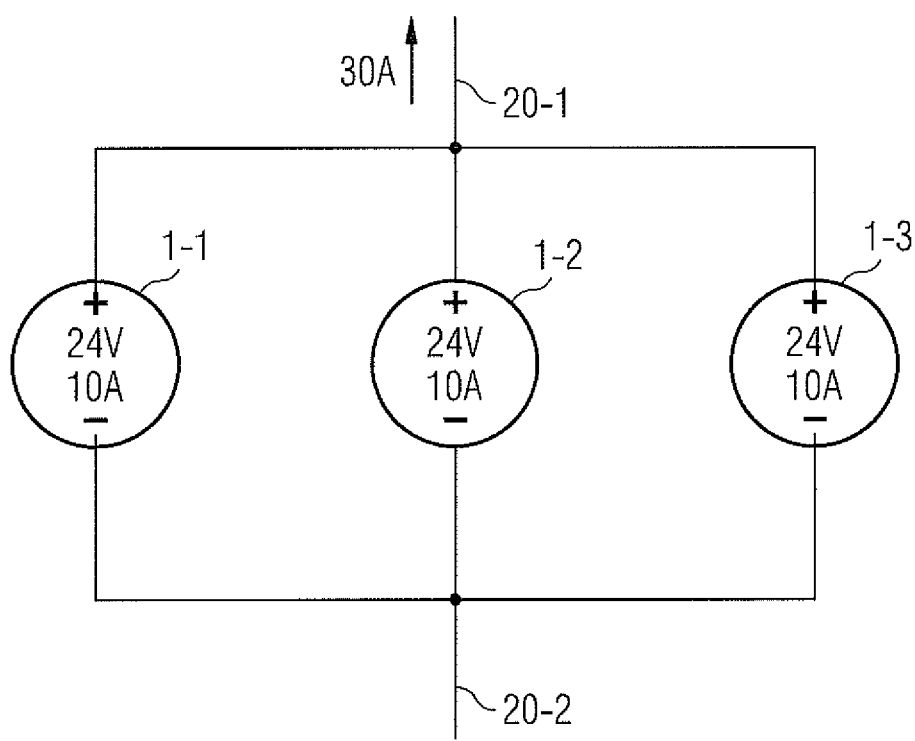
FIGS. 8A, 8B illustrate a parallel connection of several busbar power supply apparatuses according to the first aspect of the present invention mounted to a touch-safe protection cover.
Figure 8B:
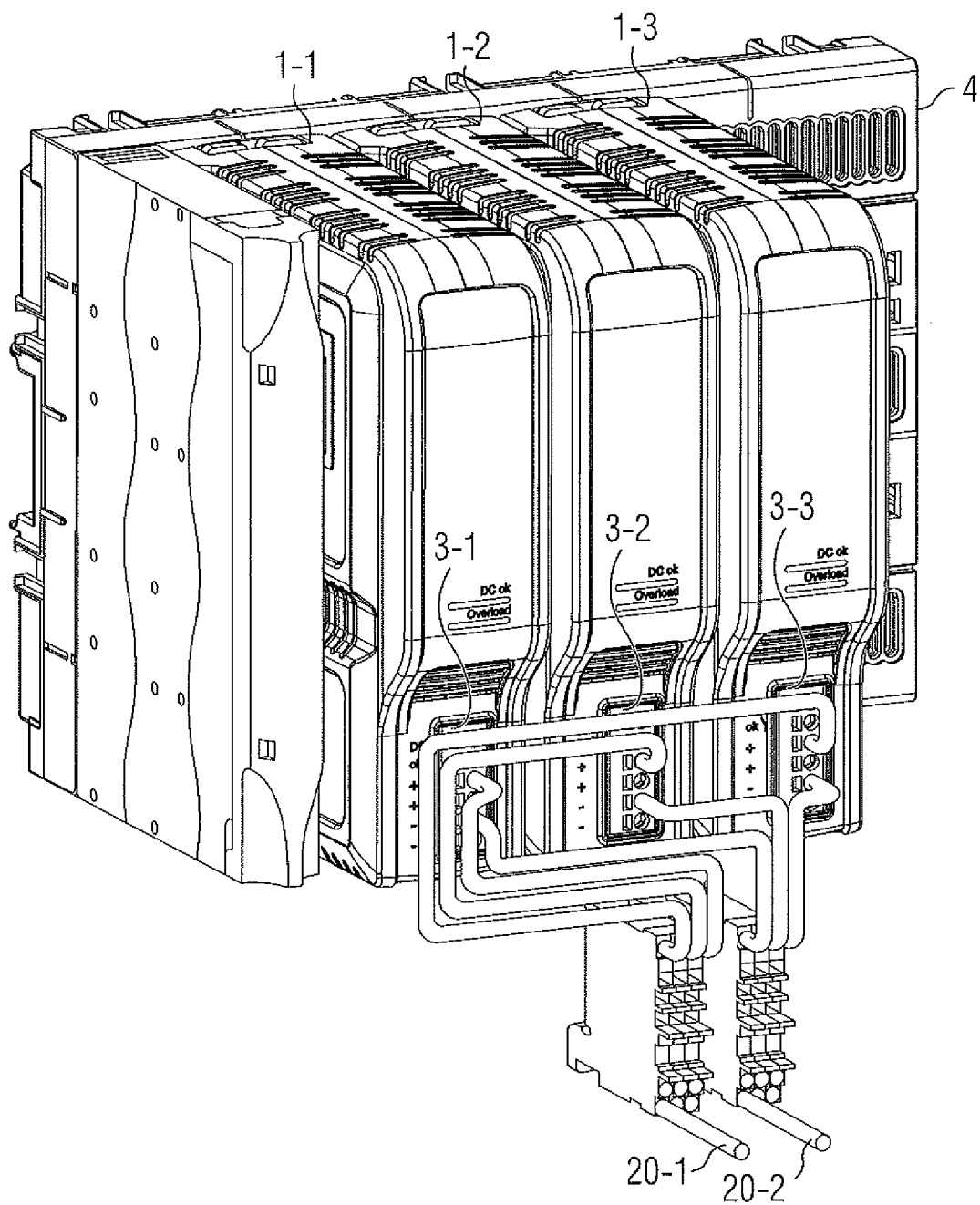

FIGS. 8A, 8B illustrate a parallel connection of several busbar power supply apparatuses 1-1, 1-2, 1-3 which are mounted in the illustrated embodiment on a common touch-safe protection cover 4. In the illustrated embodiment, each busbar power supply apparatus 1-$i$ provides a DC power supply voltage of 24 V and an electrical current I of 10 A. The busbar power supply apparatuses 1-1, 1-2, 1-3 are connected in parallel to each other to increase the DC output current. In the illustrated specific example, the total current of the parallel connected busbar power supply apparatuses 1-$i$ is 30 Ampere. A power-consuming device requiring this increased DC current can be connected via wires 20-1, 20-2 as illustrated in FIG. 8B to the assembly comprising the three parallel connected busbar power supply apparatuses 1-1, 1-2, 1-3. The busbar power supply apparatuses 1-$i$ can be connected in parallel without additional external fuses such that assembly is facilitated.

Figure 9A:
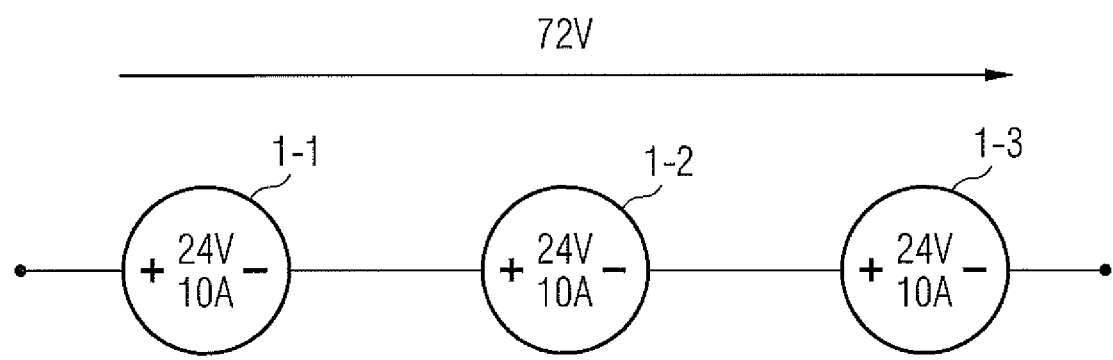
FIGS. 9A, 9B show a serial connection of busbar power supply apparatuses according to the first aspect of the present invention mounted to a touch-safe protection cover.
Figure 9B:
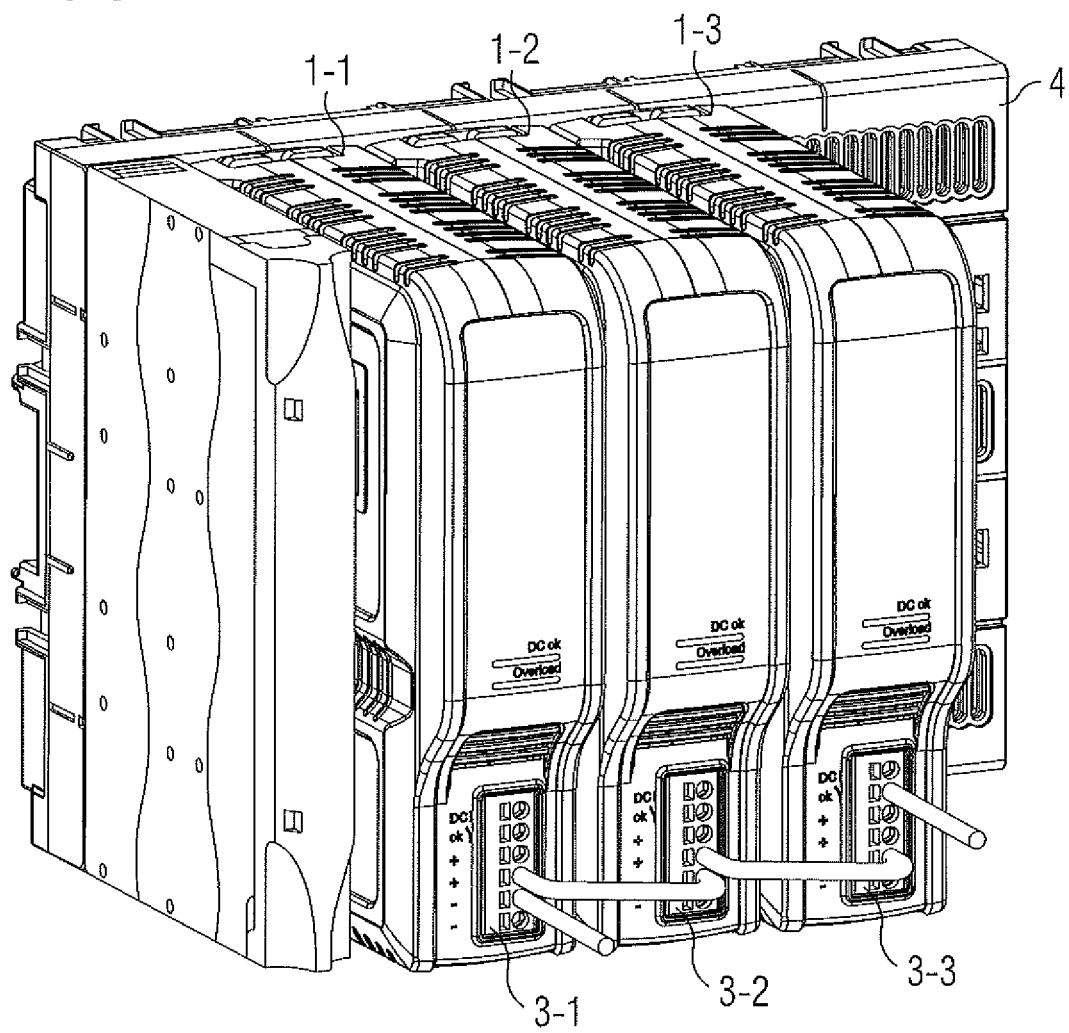

FIGS. 9A, 9B show a further possible embodiment of an assembly comprising three busbar power supply apparatuses 1-1, 1-2, 1-4 connected in series to each other. The DC interfaces 3 of the busbar power supply apparatuses 1-$i$ are connected in series to each other to increase the DC output voltage. In the illustrated specific embodiment, each busbar power supply apparatus 1 generates a DC voltage of 24 V and a DC current of 10 Ampere. By the serial connection of three busbar power supply apparatuses 1-$i$, a total output DC voltage of 72 V can be achieved.

Figure 10A:
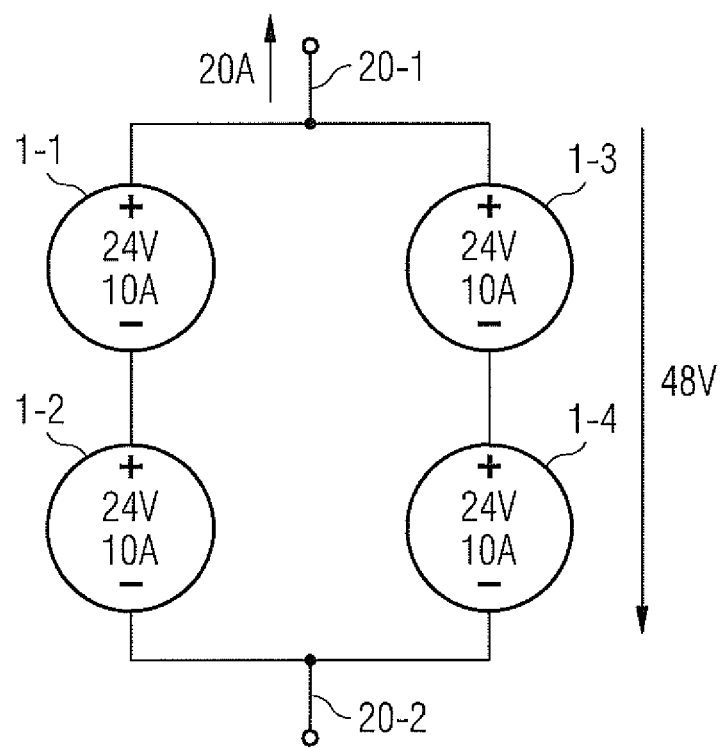
FIGS. 10A, 10B show a further possible connection where several busbar power supply apparatuses are connected in parallel and in series to each other and mounted on a touch-safe protection cover.
Figure 10B:
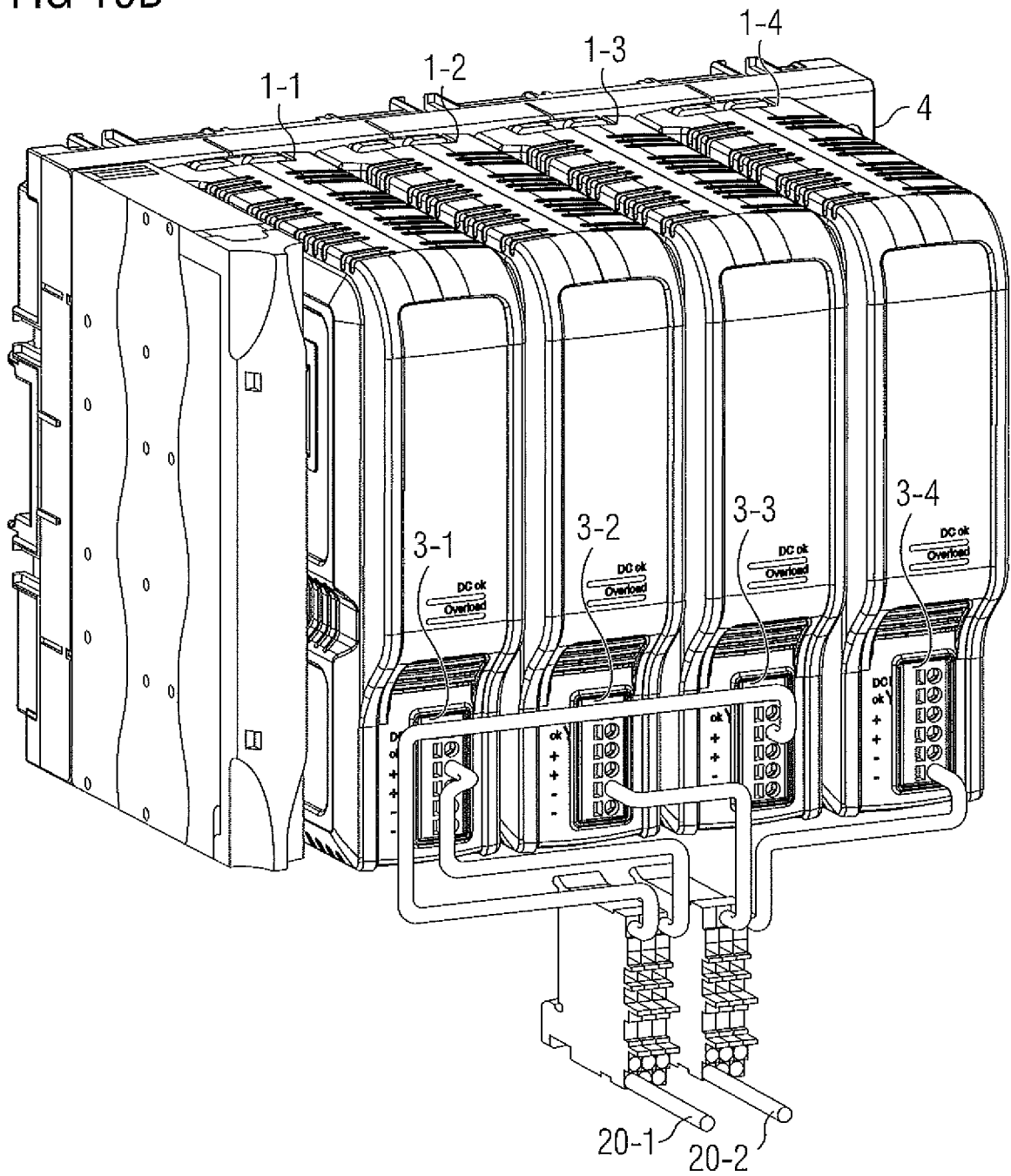

FIGS. 10A, 10B show a further exemplary connection of several busbar power supply apparatuses 1-$i$ according to the first aspect of the present invention. In the illustrated embodiment, four busbar power supply apparatuses 1-1, 1-2, 1-3, 1-4 are connected to each other and provide an increased current and an increased DC power supply voltage. In the illustrated exemplary embodiment, two pairs of serial connected busbar power supply apparatuses 1-$i$ are connected to each other to provide a total output current of 20 Ampere and a total DC power supply voltage of 48 V applied to a power-consuming device via wires 20-1, 20-2 as shown in FIG. 10B.

In a further possible embodiment, the busbar power supply apparatus 1 as illustrated in the block diagram of FIG. 5 can further comprise a communication unit (not illustrated) to provide communication signalling via separate DC communication busbars and/or AC busbars (PLC, PowerLAN) of the busbar system. This communication signalling can be used for communicating with other busbar power supply apparatuses 1 of the same busbar system and/or to communicate with an external controller of the busbar system. In a possible embodiment, the busbar power supply apparatus 1 comprises at the rear side of its housing 2 besides the AC interface 7 an additional communication interface to establish communication signalling via additional DC communication busbars of the busbar system with other busbar power supply apparatuses 1 and/or other controllers. The communication signals carried via the DC communication busbars of the system can include commands to adjust the DC power supply voltage output at the DC interface 3 of the busbar power supply apparatus 1. The communication signals carried via the DC communication busbars of the system can further comprise commands to switch on or off different busbar power supply apparatuses 1 within the system. The communication signalling performed between different devices of an automation system can use different kinds of protocols, in particular field bus protocols. The communication signalling can be performed bidirectional between different devices and/or busbar power supply apparatuses 1 of the automation system. The automation system can be extended to integrate sensor units measuring environmental parameters and notifying controllers of the automation system connected with each other via the communication busbars. In a possible embodiment, the additional DC communication busbars can be integrated in touch safe protection bars attached to the touch-safe protection cover 4. In an alternative embodiment, the communication signals can also be carried via the AC busbars 6-$i$ using powerline communication PLC.

The busbar power supply apparatus 1 can be connected to conventional busbars 6-$i$ as illustrated in FIG. 2 by means of a busbar adapter 5. Further, the busbar power supply apparatus 1 can be connected to integrated AC busbars within a touch-safe protection cover 4 as shown in FIG. 1. FIG. 11A illustrates a possible exemplary embodiment of a touch-safe protection cover 4 on which one or more busbar power supply apparatuses 1 can be mounted. In the illustrated embodiment of FIG. 11A, the touch-safe protection cover 4 includes three integrated AC busbars 6-1, 6-2, 6-3 as illustrated in FIG. 11B. The touch-safe protection cover 4 comprises in the illustrated embodiment three rows 21-1, 21-2, 21-3 of guide openings 22. The electrical contacts 8-$i$ of the AC interface 7 of the busbar power supply apparatus 1 are configured to be guided through the guide openings 22 of the touch-safe protection cover 3 including the AC busbars 6-1, 6-2, 6-3 and then to be inserted (e.g. pressed) into matching contact slots 23 within the AC busbars 6-1, 6-2, 6-3 as illustrated in FIG. 11B to establish the electrical connection with the AC busbars.

The front surface of the touch-safe protection cover 4 can further comprise rows 24-1, 24-2 to receive interlocking elements of the attached busbar power supply apparatuses 1 to increase the mechanical support. The touch-safe protection cover 4 can also include a row 25 which prevents that the busbar power supply apparatus 1 is not correctly connected to the busbar system. For instance, the row 25 can be provided such that the busbar power supply apparatus 1 comprises the correct DC polarity.

FIG. 12 shows a possible exemplary embodiment of a busbar adapter 5 which may be used to connect a busbar power supply apparatus 1 to conventional AC busbars 6-$i$ as illustrated in FIG. 2. An AC interface comprising three electrical contacts 8-$i$ as shown in FIG. 4 along with protection ribs can be inserted into the reception contacts 26-1, 26-2, 26-3 of the adapter 5 illustrated in FIG. 12. Three counter holders 27-1, 27-2, 27-3 can be provided at the rear side of the adapter 5 to hold the adapter 5 on three parallel AC busbars 6-1, 6-2, 6-3 as shown in FIG. 2.

FIG. 13 shows a possible exemplary embodiment of a profile rail adapter 28. In a possible embodiment, the AC interface 7 of the busbar power supply apparatus 1 is adapted to establish an electrical connection with a profile rail adapter 28 as illustrated in FIG. 13 which can be mounted on a profile rail and having at one side electrical contacts 31 to receive AC mains voltages supplied by the profile rail adapter 28 to the electrical contacts of the AC interface 7. As illustrated in FIG. 13, the profile rail adapter 28 comprises three receiving contacts 29 adapted to receive at least two inserted electrical contacts 8-1, 8-2, 8-3 of the AC interface 7 of the busbar power supply apparatus 1. The AC interface 7 of the busbar power supply apparatus 1 can comprise three electrical contacts to receive three phases L1, L2, L3 or only two electrical contacts 8-1, 8-2 as illustrated in FIG. 4 to supply only two electrical phases (e.g. phases L1, L2) via the profile rail adapter 28 to the busbar power supply apparatus 1 receiving two power supply phases L1, L2 as also illustrated in the block diagram of FIG. 5. On the rear side, the housing of the profile rail adapter 28 comprises a recession 30 and can be snapped on a profile rail. The profile rail adapter 28 comprises in the illustrated embodiment two electrical contacts 31-1, 31-2 to receive two AC mains voltages L1, L2 applied to the electrical contact pairs 8-1, 8-2 of the AC interface 7 of the busbar power supply apparatus 1 as illustrated in FIG. 4 when plugged into the receiving electrical contacts 29-1, 29-2 of the profile rail adapter 28 shown in FIG. 13.

In an alternative implementation, the profile rail adapter 28 can comprise three electrical contacts 31-1, 31-2, 31-3 to supply three phases L1, L2, L3 to the busbar power supply apparatus 1.

The number of electrical contacts 8-i of the AC interface 7 can vary depending on the use case of the busbar power supply apparatus 1. In any case, the mains AC interface 7 is configured to establish an electrical connection with at least two busbars of the busbar system. The AC interface 7 can comprise two contacts for connection with an AC mains voltage L and with a protective conductor N. Further, the AC mains voltage can comprise two contacts 8-1, 8-2 for connection with two different AC mains voltages L, e.g. L1+L2, L2+L3, L1+L3. In a further possible embodiment, the AC interface 7 can comprise three electrical contacts 8-1, 8-2, 8-3 as also illustrated in FIG. 4 for connection with three AC mains voltages L1, L2, L3.

The busbar power supply apparatus 1 according to the first aspect of the present invention can be used in an automation system, for instance in a production facility. The busbar power supply apparatus 1 provides at its DC interface 3, a DC power supply of e.g. 24 V to supply a power-consuming electrical device. This power-consuming electrical device can be for instance a control device of the automation system, e.g. a control device controlling an electrical motor. Several busbar power supply apparatuses 1 can be connected in series and/or in parallel to each other as illustrated in the embodiments of FIGS. 8, 9, 10 to adapt the power supply voltage $V_{DC}$ and/or the power supply current $I_{DC\ to}$ the needs of the power-consuming electric device of the automation system. The busbar power supply apparatuses 1 of the automation system can be connected to a single touch-safe protection cover 4 including several integrated AC busbars 6. The mounting of the busbar power supply apparatus 1 can be performed very easily and fast without any risk for the user when performing the installation. The automation system is very flexible and requires only a very limited space. The mounting of the busbar power supply apparatus 1 to the touch-safe protection cover 4 can be performed without the need of any tools. The electrical connection between the busbar power supply apparatus 1 and the protection cover 4 or the adapters is very safe and reliable and requires no specific skills of the installing technician. No separate fuses outside the housing 2 of the busbar power supply apparatus 1 are required. The busbar power supply apparatus 1 can be mounted along with other devices of the system to the same busbar system. Accordingly, the busbar power supply apparatus 1 according to the first aspect of the present invention can be used in a modular system including other devices, in particular control devices which can be mounted to the same busbars and/or protection cover. Moreover, the automation system according to the second aspect of the present invention can comprise power-consuming electrical devices and/or busbar power supply apparatuses 1-i each comprising an integrated communication unit allowing bidirectional communication between the power-consuming electrical devices, in particular control devices applied with a DC voltage by an associated busbar power supply apparatus 1-i, and even bidirectional communication with the busbar power supply apparatus 1-i itself. In a preferred embodiment of the automation system according to the second aspect of the present invention, the communication between the power-consuming electrical devices and/or the busbar power supply apparatuses 1-i of the automation system is performed via separate DC busbars carrying the communication signals. In a possible embodiment of the automation system, the power-consuming electrical devices and/or busbar power supply apparatuses 1 can speak to each other by communication signalling to exchange information and to adjust actuators. The communication signals carried via the DC communication busbars of the automation system can be used to adjust the DC power supply voltage output at the DC interface 3 of the busbar power supply apparatus 1 and/or to switch on/off the busbar power supply apparatus 1-i. A power-consuming electrical device may signal its required DC power consumption such that the DC power supply voltage and/or the DC power supply current is adjusted automatically.

Further embodiments of the busbar power supply apparatus 1 and the automation system according to the present invention are possible. In a possible embodiment, the busbar power supply apparatus 1 can comprise a display at its front side for indicating its current operation state to a user. In a still further possible embodiment, the busbar power supply apparatus 1 can comprise at its front side a user interface for a technician for inputting parameters to the automation system. The information input at the input interface of the busbar power supply apparatus 1 can be communicated to other devices of the automation system. In a still further possible embodiment, the busbar power supply apparatus 1 can comprise at its front side a graphical user interface, in particular a graphical user interface with a touchscreen.

In a still further possible embodiment of the busbar power supply apparatus 1 and the automation system according to the present invention, the busbar power supply apparatus 1 can comprise an integrated wireless communication interface for communicating with mobile units such as a smartphone of a user. The wireless communication interface can also be used for bidirectional wireless communication between different busbar power supply apparatuses 1 and/or power-consuming electrical devices of the automation system.

The invention claimed is:
1. A busbar power supply apparatus comprising:
a housing including a front wall, a rear wall and four side walls connecting the front wall and the rear wall, wherein said housing is configured to receive different electrical units or electrical components therein;
at least one DC interface provided in said housing; and
an AC interface provided at said rear wall of said housing, said AC interface provided with electrical contacts configured to establish an electrical connection with AC busbars of a busbar system to receive AC mains voltages converted by an integrated AC/DC power conversion unit into a DC power supply voltage applied to said at least one DC interface,
wherein the electrical contacts extend through corresponding openings defined in said rear wall so that the electrical contacts protrude from the housing of the busbar power supply apparatus.

2. The busbar power supply apparatus according to claim 1 wherein the electrical contacts of said AC interface are;
configured to be guided through guide openings of a touch-safe protection cover including the AC busbars and to be inserted into matching contact slots within the AC busbars to establish the electric connection with the AC busbars; or
configured to be attached to massive AC busbars not having contact slots.

3. The busbar power supply apparatus according to claim 1 wherein the electrical contacts of said AC interface are configured to be inserted into matching contact slots of a busbar adapter mounted on the AC busbars to establish the electrical connection with the AC busbars of said busbar power supply apparatus by said busbar adapter.

4. The busbar power supply apparatus according to claim 1 wherein the AC interface is connected to internal fuses integrated in the housing of said busbar power supply apparatus.

5. The busbar power supply apparatus according to claim 1, further comprising:
a circuit having an input filter unit adapted to filter the AC mains voltages received via the AC interface of said busbar power supply apparatus,
a rectifier unit adapted to rectify the filtered AC mains voltages,
an inrush current limiter unit,
a power factor correction unit to provide a power factor correction connected to an input of the AC/DC power conversion unit of said busbar power supply apparatus and
an output filter unit being provided between an output of the AC/DC power conversion unit and the DC interface of said busbar power supply apparatus.

6. The busbar power supply apparatus according to claim 1 wherein the electrical contacts are configured to establish electrical contact with the AC busbars of said busbar system formed by parallel busbars extending in a horizontal or a vertical direction.

7. The busbar power supply apparatus according to claim 1 wherein the DC interface of said busbar power supply apparatus is configured to be connectable with further DC interfaces of other busbar power supply apparatuses in parallel to increase the DC output current and/or in series to increase the DC output voltage.

8. The busbar power supply apparatus according to claim 1 wherein the housing of said busbar power supply apparatus is made of an electrically insulating material and is formed to provide convection cooling of electrical units integrated in the housing.

9. The busbar power supply apparatus according to claim 1 comprising a communication unit to provide communication signalling via DC communication busbars of the busbar system with other busbar power supply apparatuses of said busbar system and/or with an external controller of said busbar system.

10. The busbar power supply apparatus according to claim 9 wherein the communication signals carried via the DC communication busbars comprise commands to adjust the DC power supply voltage output at the DC interface of the busbar power supply apparatus and/or to switch on/off the busbar power supply apparatus.

11. The busbar power supply apparatus according to claim 1 wherein the AC/DC power conversion unit is configured to separate galvanically its AC input from its DC output.

12. The busbar power supply apparatus according to claim 1 wherein the AC interface is configured to establish an electrical connection with at least two busbars of said busbar system to receive at least one AC mains voltage.

13. The busbar power supply apparatus according to claim 1 wherein the AC interface of the busbar power supply apparatus is further configured to establish an electrical connection with a profile rail adapter mounted on a profile rail and having at a front side electrical contacts to receive AC mains voltages supplied by said profile rail adapter to the electrical contacts of the AC interface.

14. The busbar power supply apparatus according to claim 1 wherein the AC interface comprises protection ribs to protect the electrical contacts of the AC interface and to provide mechanical support of the busbar power supply apparatus.

15. An automation system comprising:
a busbar power supply apparatus including;
a housing including a front wall, a rear wall and four side walls connecting the front wall and the rear wall, wherein said housing is configured to receive different electrical units or electrical components therein;
at least one DC interface provided in said housing;
an AC interface provided at said rear wall of said housing, said AC interface provided with electrical contacts configured to establish an electrical connection with AC busbars of a busbar system to receive AC mains voltages converted by an integrated AC/DC power conversion unit into a DC power supply voltage applied to said at least one DC interface, wherein the electrical contacts extend through corresponding openings defined in said rear wall so that the electrical contacts protrude from the housing of the busbar power supply apparatus; and
power-consuming electrical devices, each receiving DC power from said at least one DC interface.

16. The busbar power supply apparatus according claim 1 wherein the housing includes cooling slots to provide convection cooling of electrical units integrated in the housing.

17. The busbar power supply apparatus according to claim 1 wherein the housing is formed such that it provides a cooling funnel.

18. The busbar power supply apparatus according to claim 1 wherein the housing is formed such that it provides a cooling funnel in a vertical direction.

19. The busbar supply apparatus of claim 1, wherein said DC interface is provided in the front wall of said housing.

* * * * *